(12) United States Patent
Wu (10) Patent No.: US 11,564,330 B2
(45) Date of Patent: Jan. 24, 2023

(54) FAN CONTROL CIRCUIT

(71) Applicant: SEA SONIC ELECTRONICS CO., LTD., Taipei (TW)

(72) Inventor: Wei-Chen Wu, Taipei (TW)

(73) Assignee: SEA SONIC ELECTRONICS CO., LTD., Taipei (TW)

( * ) Notice: Subject to any disclaimer, the term of this patent is extended or adjusted under 35 U.S.C. 154(b) by 352 days.

(21) Appl. No.: 15/930,812

(22) Filed: May 13, 2020

(65) Prior Publication Data
US 2021/0360820 A1 Nov. 18, 2021

(51) Int. Cl.
*H05K 7/20* (2006.01)
*G05B 13/02* (2006.01)

(52) U.S. Cl.
CPC ....... *H05K 7/20209* (2013.01); *G05B 13/024* (2013.01); *H05K 7/20909* (2013.01); *H05K 7/20945* (2013.01)

(58) Field of Classification Search
CPC . H05K 7/20209; H05K 7/20945; G06B 13/24
See application file for complete search history.

(56) References Cited

U.S. PATENT DOCUMENTS

| | | | |
|---|---|---|---|
| 5,757,172 A * | 5/1998 | Hunsdorf | G05F 1/567 323/277 |
| 7,291,995 B2 | 11/2007 | Chen | |
| 7,414,375 B2 | 8/2008 | Lee | |
| 7,789,130 B2 | 9/2010 | Chen | |
| 7,841,837 B2 | 11/2010 | Chen | |
| 2009/0167228 A1* | 7/2009 | Chung | H05K 7/20209 318/473 |
| 2011/0320061 A1* | 12/2011 | Chen | G05D 16/185 700/300 |

FOREIGN PATENT DOCUMENTS

| | | |
|---|---|---|
| CN | 207382768 U | 5/2018 |
| CN | 109429469 A | 3/2019 |
| CN | 109695593 A | 4/2019 |

* cited by examiner

*Primary Examiner* — Mukundbhai G Patel
(74) *Attorney, Agent, or Firm* — Muncy, Geissler, Olds & Lowe, P.C.

(57) ABSTRACT

A fan control circuit for controlling at least one fan of a power supply device includes a load sensing unit, a temperature sensing unit, a control unit connected to the load sensing unit, the temperature sensing unit and the fan, and a mode switching unit. The load sensing unit generates a load signal according to an output condition of the power supply device. The temperature sensing unit senses the temperature in the power supply device and generates a temperature signal. The control unit comprises a low-speed operating mode for controlling the fan according to the load signal, a mute mode for controlling the fan according to the temperature signal, and a full-speed operating mode for controlling the fan to run in a rated rotational speed. The mode switching unit controls the control unit to adjust the rotational speed of the fan by one of the three modes.

9 Claims, 9 Drawing Sheets

FAN CONTROL CIRCUIT

FIELD OF THE INVENTION

The present invention relates to a fan control circuit, and particularly to a fan control circuit controlling a fan to run at a rated rotational speed.

BACKGROUND OF THE INVENTION

Patents, CN 109695593 A, U.S. Pat. No. 7,291,995, CN 109429469 A, CN 207382768 U, U.S. Pat. Nos. 7,841,837, 7,789,130 and 7,414,375, disclose some examples of current cooling fans. Taking CN 109695593 A for example, it discloses a fan control circuit including a normal operating mode and a low-noise mode according to different received signals. In the normal operating mode, the fan control circuit adjusts the rotational speed of the cooling fan according to the operating temperature of a processing unit; in the low-noise mode, the fan control circuit first turns off the cooling fan and only drives the cooling fan to start rotating once the operating temperature of the processing unit reaches a certain value. It is known from the description above that, the rotational speed of cooling fans is adjusted according to different conditions such as temperatures. However, it fails to disclose that cooling fans have a function of operating at a rated rotational speed, such that the conventional fans are unable to perform reinforced heat dissipation by directly using a maximum rated rotational speed. Further, in a conventional structure, if determining whether the function of a cooling fan is abnormal or determining the durability of the cooling fan is desired, it cannot be measured by adjusting the cooling fan to directly enter a full-speed operating mode. Instead, the cooling fan already installed in an electronic device needs to be additionally removed in order to perform such detection, and the cooling fan is then installed back into the electronic device once the cooling fan is verified as being functional. Further, taking the U.S. Pat. No. 7,841,837 for example, although it further discloses that the rotational speed of the cooling fan is controlled according to an open-circuit or closed-circuit state of a switch, the disclosure of the description likewise does not provide technical contents of controlling the cooling fan to run at a rated rotational speed. Hence, it is considered that the cooling fan disclosed above is unable to enhance the heat dissipation function, or accordingly to allow a user to measure functions and durability of the fan.

SUMMARY OF THE INVENTION

The main object of the present invention is to solve issues of a conventional cooling fan that lack a function of operating by a rated rotational speed.

To achieve the foregoing object, the present invention provides a fan control circuit. The fan control circuit is provided in a power supply device and controlling at least one fan belonged to the power supply device. The fan control circuit includes a load sensing unit, a temperature sensing unit, a control unit electrically connected to the temperature sensing unit, the load sensing unit and the fan, and a mode switching unit electrically connected to the control unit. The load sensing unit is electrically connected to an output terminal of the power supply device so as to generate a load signal according to an output condition of the output terminal. The temperature sensing unit senses the temperature in the power supply device, and generates a temperature signal. The control unit comprises a low-speed operating mode for controlling the rotational speed of the fan according to the load signal, a mute mode for controlling the rotational speed of the fan according to the temperature signal, and a full-speed operating mode of controlling the fan to run at a rated rotational speed. The mode switching unit provides a mode switching signal generated from a user operation to the control unit, wherein the mode switching signal determines that the control unit controls the fan in one of the low-speed operating mode, the mute mode and the full-speed operating mode.

In one embodiment, the low-speed mode is divided according to a load threshold into a first fixed speed interval and a first acceleration interval following the first fixed speed interval. The rotational speed of fan in the first acceleration speed is proportional to a load of the power supply device.

In one embodiment, the mute mode is divided into a fan suspended operation interval and a plurality of second acceleration intervals according to a plurality of temperature rise thresholds. The rotational speed of the fan in each of the plurality of second acceleration intervals is proportional to the temperature in the power supply device.

In one embodiment, the mute mode includes a second fixed speed interval between two of the plurality of second acceleration intervals.

In one embodiment, the mode switching unit includes at least one switch element provided on an outer side of the power supply device, and at least one signal separating element connected to the switch element and the control unit.

In one embodiment, the signal separating element is a photocoupler.

In one embodiment, the control unit is preset to control the fan by the mute mode.

Accordingly, the present invention provides the following features compared to the prior art. In the present invention, the control unit includes the full-speed operating mode, such that the fan control circuit is able to directly control the fan to run by a rated rotational speed, enabling the fan to provide a reinforced heat dissipation function or accordingly allow a user to measure functions or durability of the fan. Further, once the mode switching unit of the present invention is operated by a user, the control unit is controlled by the mode switching to switch the operating mode of the fan, such that the user is enabled to adjust to the full-speed operating mode or to adjust from the full-speed operating mode to a required operating mode according to utilization requirements during the operation process of the fan.

DETAILED DESCRIPTION OF THE PREFERRED EMBODIMENTS

Details and technical contents of the present invention are given with reference to the drawings below.

Figure 8:
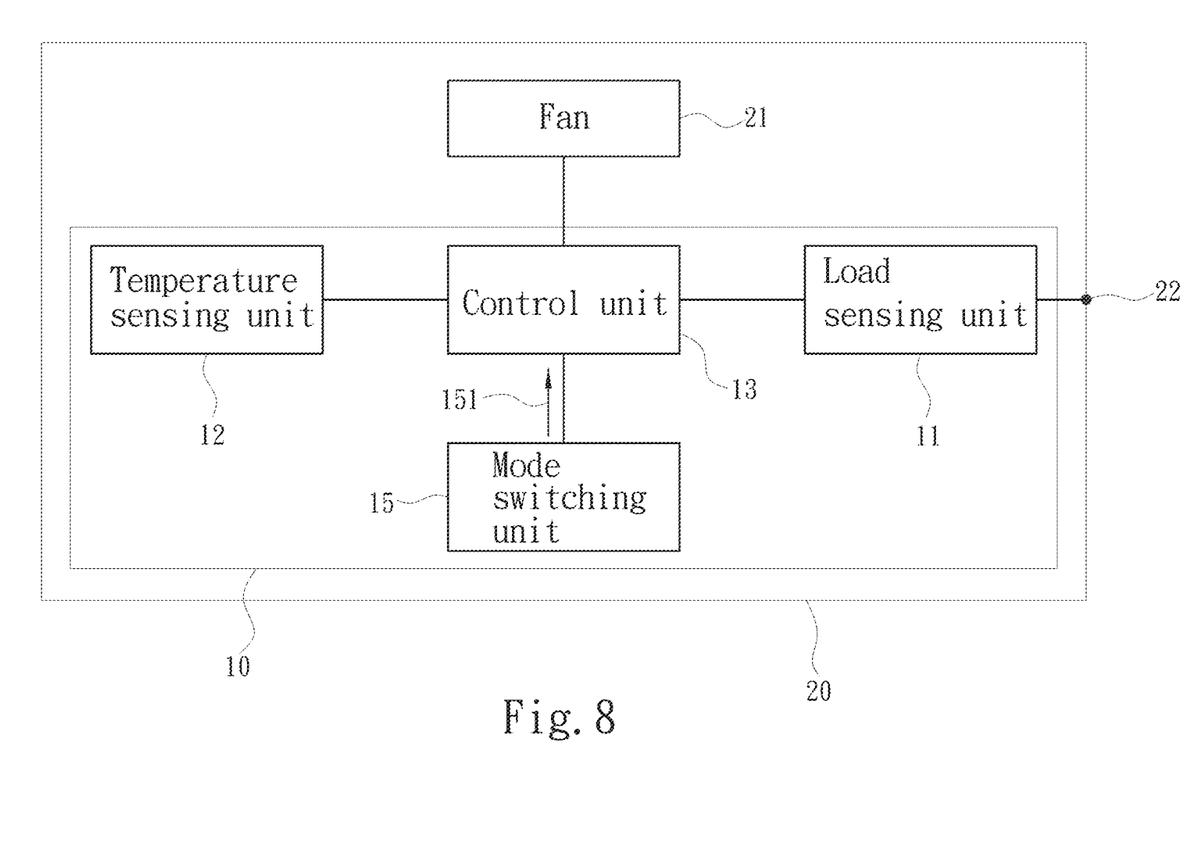
FIG. 8 is a block diagram of a mode switching unit providing a mode switching signal according to an embodiment of the present invention.

Referring to FIG. 1, FIG. 2, FIG. 3, FIG. 4, FIG. 5, FIG. 6, and FIG. 7, the present invention provides a fan control circuit 10. The fan control circuit 10 is provided in a power supply device 20, and controls a fan 21 belonged in the power supply device 20 so as to accordingly adjust a rotational speed of the fan 21. The fan control circuit 10 includes a load sensing unit 11, a temperature sensing unit 12, a control unit 13 and a mode switching unit 15. The load sensing unit 11, the temperature sensing unit 12, the control unit 13 and the mode switching unit 15 are all implemented by circuits formed by electronic devices. More specifically, the load sensing unit 11 is electrically connected to an output terminal 22 of the power supply device 20, and generates a load signal 111 according to an output condition of the output terminal 22. The associated details of implementation are generally known to a skilled person in the art on the basis of the prior art, for example, detection for the output power and output current of the power supply device 20, and thus such details are omitted for brevity herein. Further, the temperature sensing unit 12 is provided in the power supply device 20. The temperature sensing unit 12 senses a change in the temperature in the power supply device 20 and generates a temperature signal 121 according to an ambient temperature in the power supply device 20. Further, the control unit 13 is electrically connected to the temperature sensing unit 12, the load sensing unit 11, and the fan 21. The control unit 13 receives the load signal 111 transmitted from the load sensing unit 11 and the temperature signal 121 transmitted from the temperature sensing unit 12. Meanwhile, the control unit 13 further generates a driving signal 131 for driving the fan 21 to run. In detail, the driving signal 131 controls the rotational speed of the fan 21. The control unit 13 includes a low-speed operating mode 132 controlling the rotational speed of the fan 21 according to the load signal 111, a mute mode 133 controlling the rotational speed of the fan 21 according to the temperature signal 121, and a full-speed operating mode 134 controlling the fan 21 to run at a rated rotational speed. Besides, the low-speed operating mode 132 referred to herein is to control the rotational speed of the fan 21 at a speed sufficient to fundamentally satisfy heat dissipation requirements of each work phase of the fan 21, rather than to keep the fan 21 at a lowest speed continuously. Further, the mute mode 133 is designed according to a noise generated when the fan 21 is running and heat dissipation requirements of each work phase of the power supply device 20. Referring to FIG. 8, the mode switching unit 15 is electrically connected to the control unit 13, and provides a mode switching signal 151 to the control unit 13 once operated by the user. The mode switching signal 151 determines that the control unit 13 controls the fan 21 in one of the low-speed operating mode 132, the mute mode 133 and the full-speed operating mode 134.

Next, the implementation details of the fan control circuit 10 of the present invention are given below. Referring to FIG. 1, FIG. 2, FIG. 3, FIG. 4, FIG. 5, FIG. 6, FIG. 7, and FIG. 8, in order to illustrate the implementation process of the present invention, here it takes the mute mode 133 as a default mode for the fan 21 once the power supply device 20 is activated. At this point, the control unit 13 receives the temperature signal 121 transmitted from the temperature sensing unit 12, and the control unit 13 generates the driving signal 131 according to the temperature signal 121 to accordingly control the rotational speed of the fan 21. Once the temperature signal 121 indicates a temperature rise in the power supply device 20, the control unit 13 increases the rotational speed of the fan 21 according to working conditions of the mute mode 133. Once the mode switching unit 15 receives a user operation and issues the mode switching signal 151, the control unit 13 immediately switches the speed of the fan 21 according to the mode switching signal 151. Further, in one embodiment, if the mode switching unit 15 is a switch, the mode switching signal 151 changes as turning on/off of the switch changes. The control unit 13 determines the operating mode according to the number of changes of the mode switching signal 151, and the control unit 13 performs the change according to a predetermined mode change sequence. For example, the low-speed operating mode 132 follows the mute mode 133, and the full-speed operating mode 134 then follows the low-speed operating mode 132. Thus, if a change occurs for the first time in the mode switching signal 151, the control unit 13 switches to the low-speed operating mode 132 for continually controlling the fan 21 based on the predetermined mode change sequence. If the change occurs again in the mode switching signal 151, the control unit 13 then switches to the full-speed operating mode 134 based on the predetermined mode change sequence. Once the control unit 13 enters the full-speed operating mode 134, the control unit 13 controls the fan 21 to run at a rated rotational speed directly instead of controlling according to the load signal 111 and the temperature signal 121. However, it should be understood that the mode switching signal 151 is not limited to the implementation example in the described above, and any implementation solution achieving the same goal is to be encompassed by the present invention.

Compared to the prior art, in addition to enabling a user to initiatively change the operating mode of the fan 21 according to implementation requirements by the mode switching unit 15, the control unit 13 further includes the full-speed operating mode 134, such that the fan control circuit 10 is able to directly control the fan 21 to run at the rated rotational speed, thereby the fan 21 to enhance the heat dissipation function and accordingly to allow the user to measure functions and durability of the fan 21.

Again referring to FIG. 1, FIG. 4, and FIG. 5, in one embodiment, the low-speed operating mode 132 is divided according to a load threshold 135 into a first fixed speed interval 136 and a first acceleration interval 137 following the first fixed speed interval 136. The rotational speed in the first fixed speed interval 136 is a fixed value. In practice, if the load signal 111 does not reach the load threshold 135, the control unit 13 controls the fan 21 to run at a rotational speed according to the first fixed speed interval 136; if the load signal 111 reaches the load threshold 135, the control unit 13 transmits the driving signal 131 and controls the fan 21 to run at a rotational speed according to the first acceleration interval 137, such that the rotational speed of the fan 21 in the first acceleration interval 137 is proportional to the load of the power supply device 20. For example, a value of the load threshold 135 is 20% of the rated output current of the power supply device 20, or 20% of the rated load of the power supply device 20.

Figure 1:
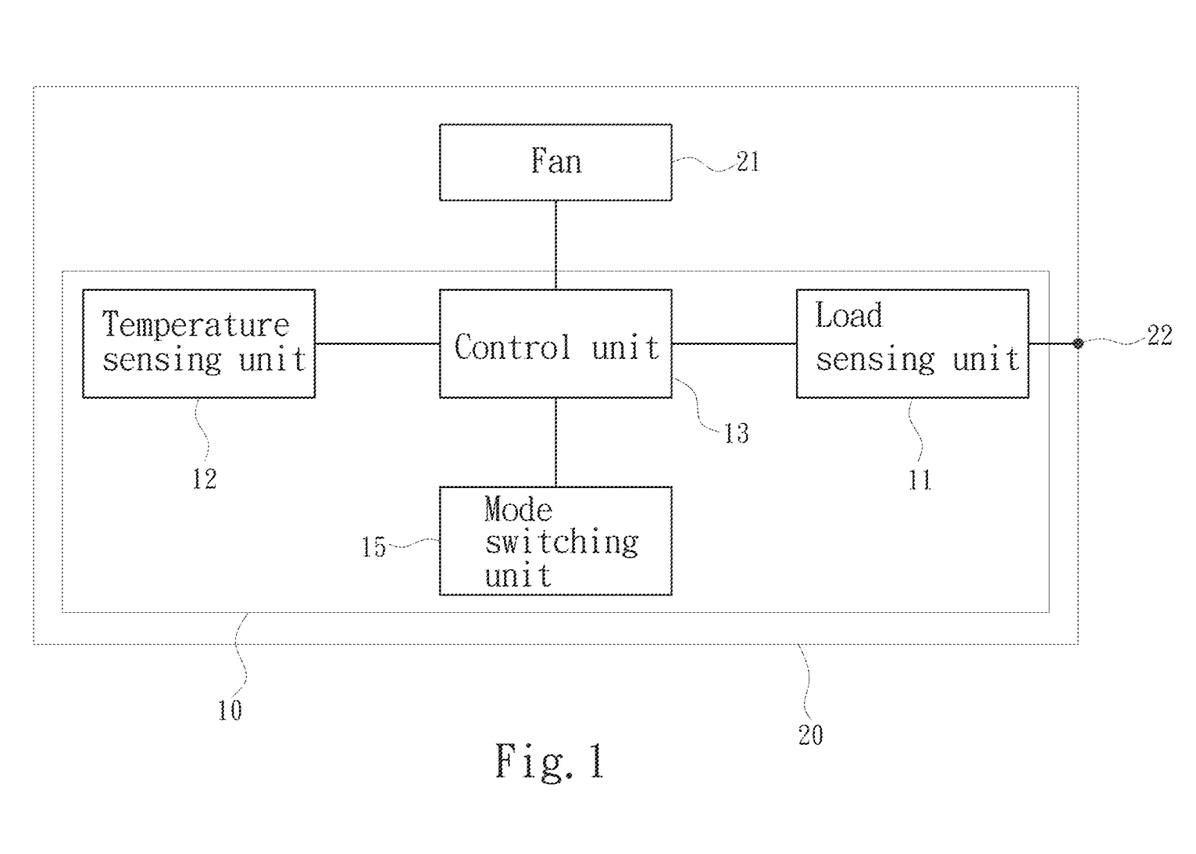
FIG. 1 is a block schematic diagram according to an embodiment of the present invention.
Figure 2:
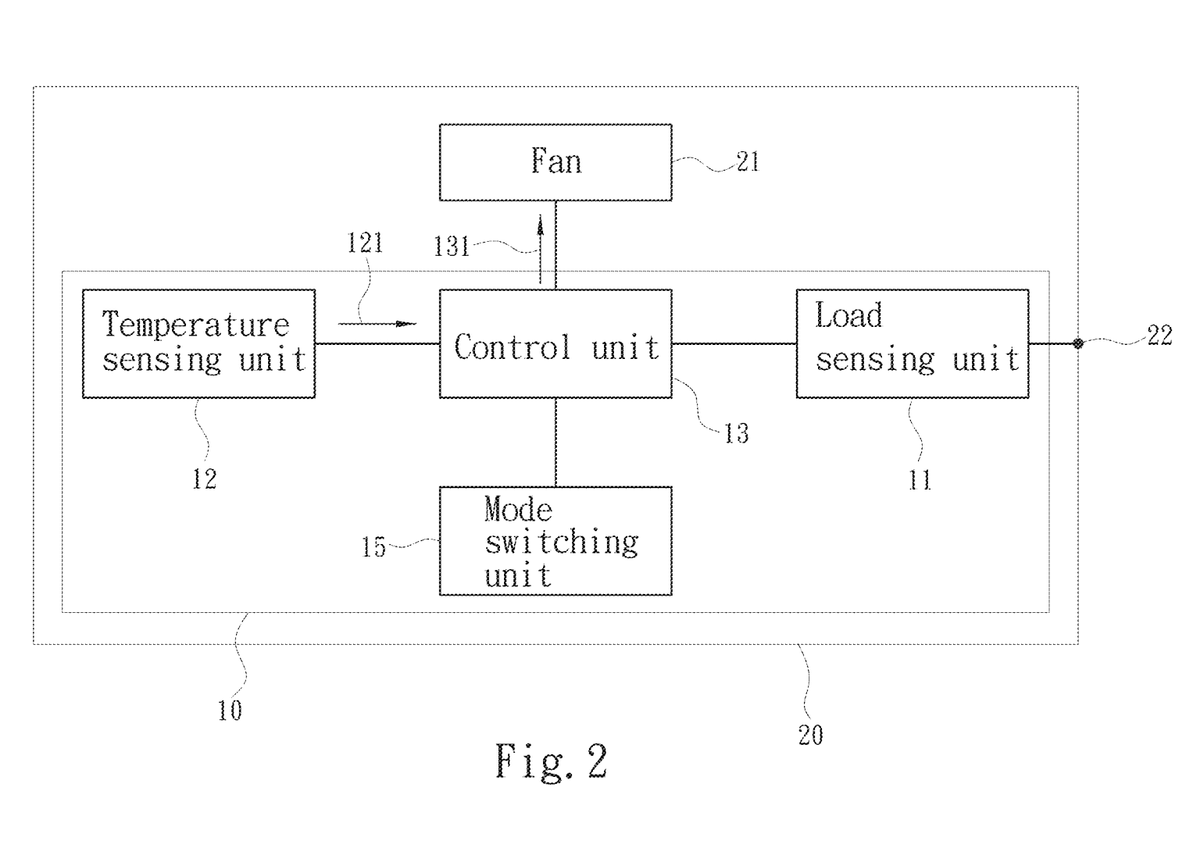
FIG. 2 is a block schematic diagram of a mute mode according to an embodiment of the present invention.
Figure 3:
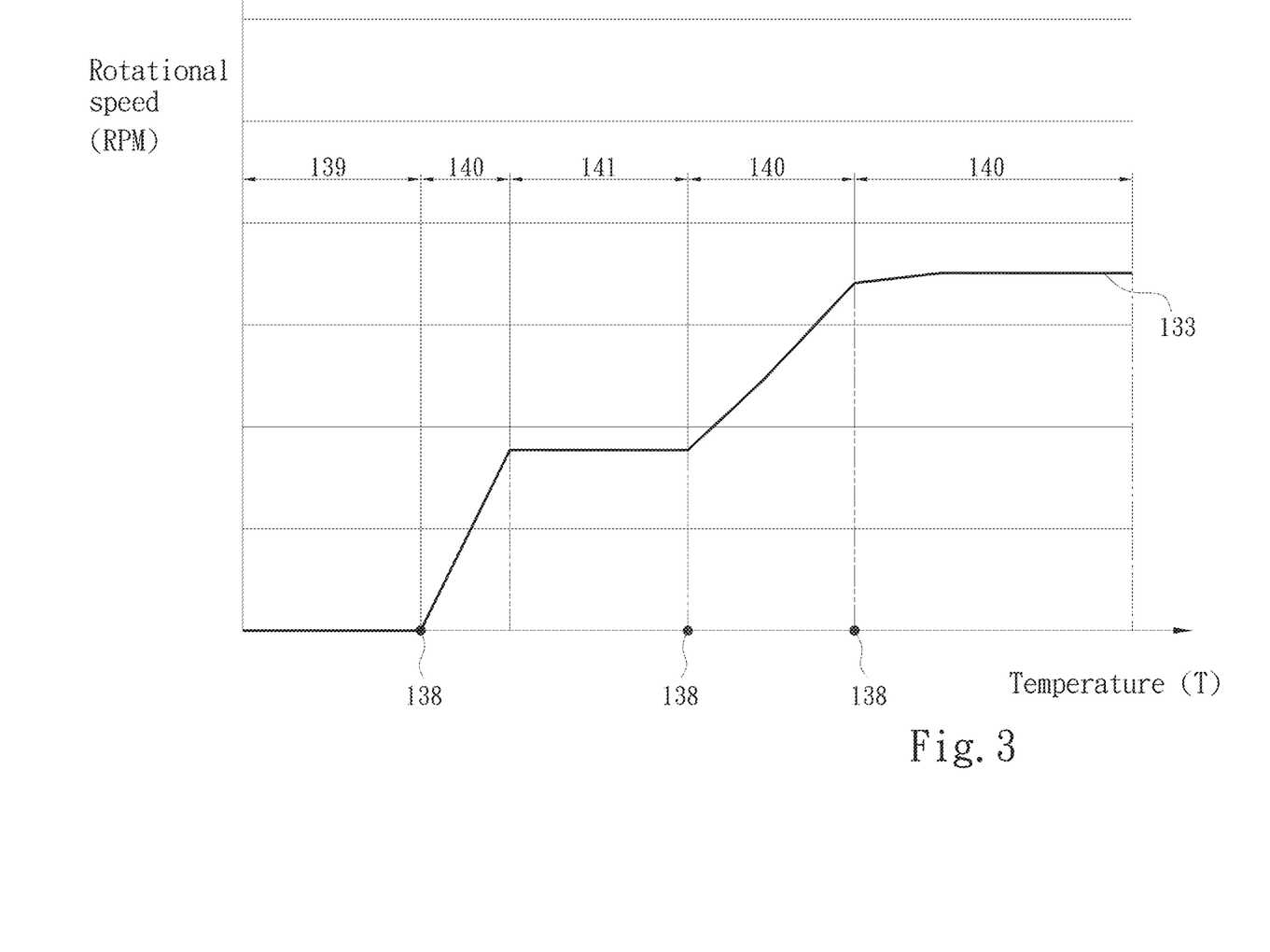
FIG. 3 is a schematic diagram of a rotational speed of a fan in a mute mode according to an embodiment of the present invention.
Figure 4:
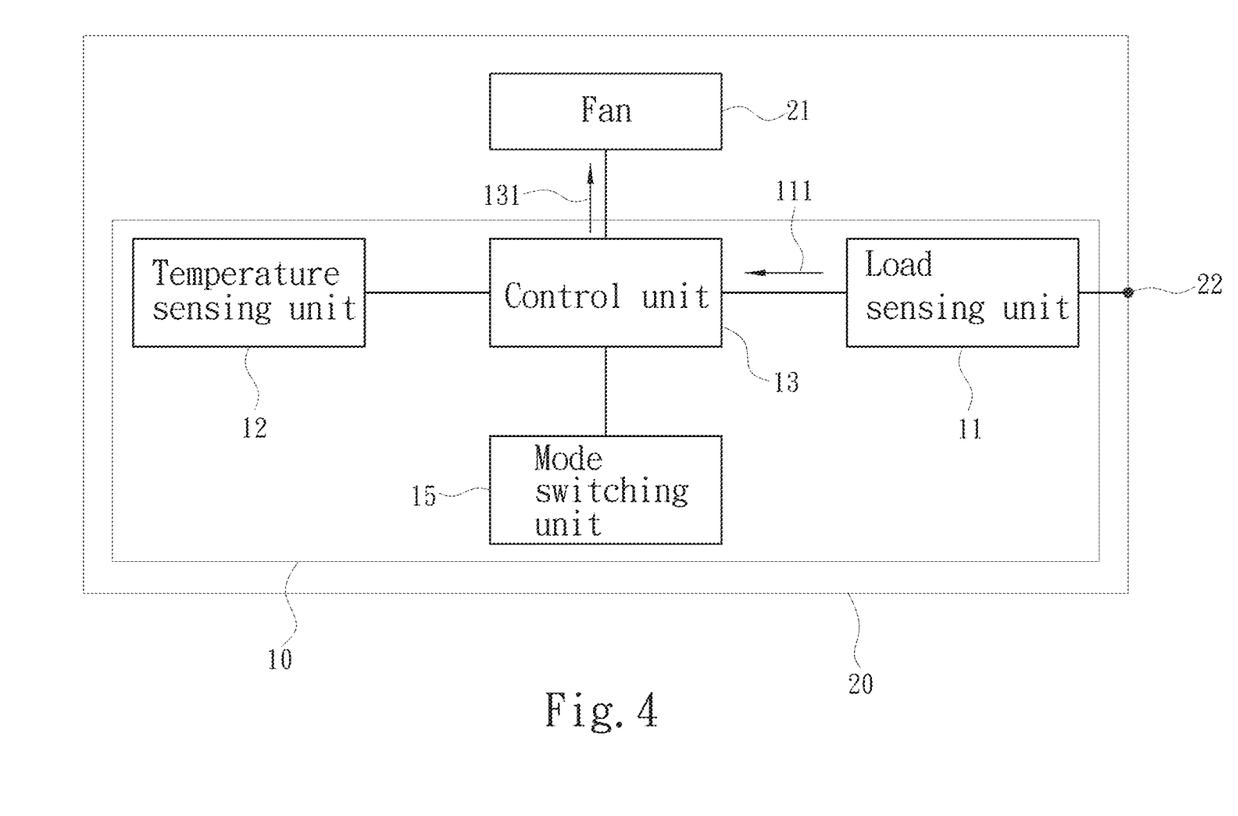
FIG. 4 is a schematic diagram of a low-speed operating mode according to an embodiment of the present invention.
Figure 5:
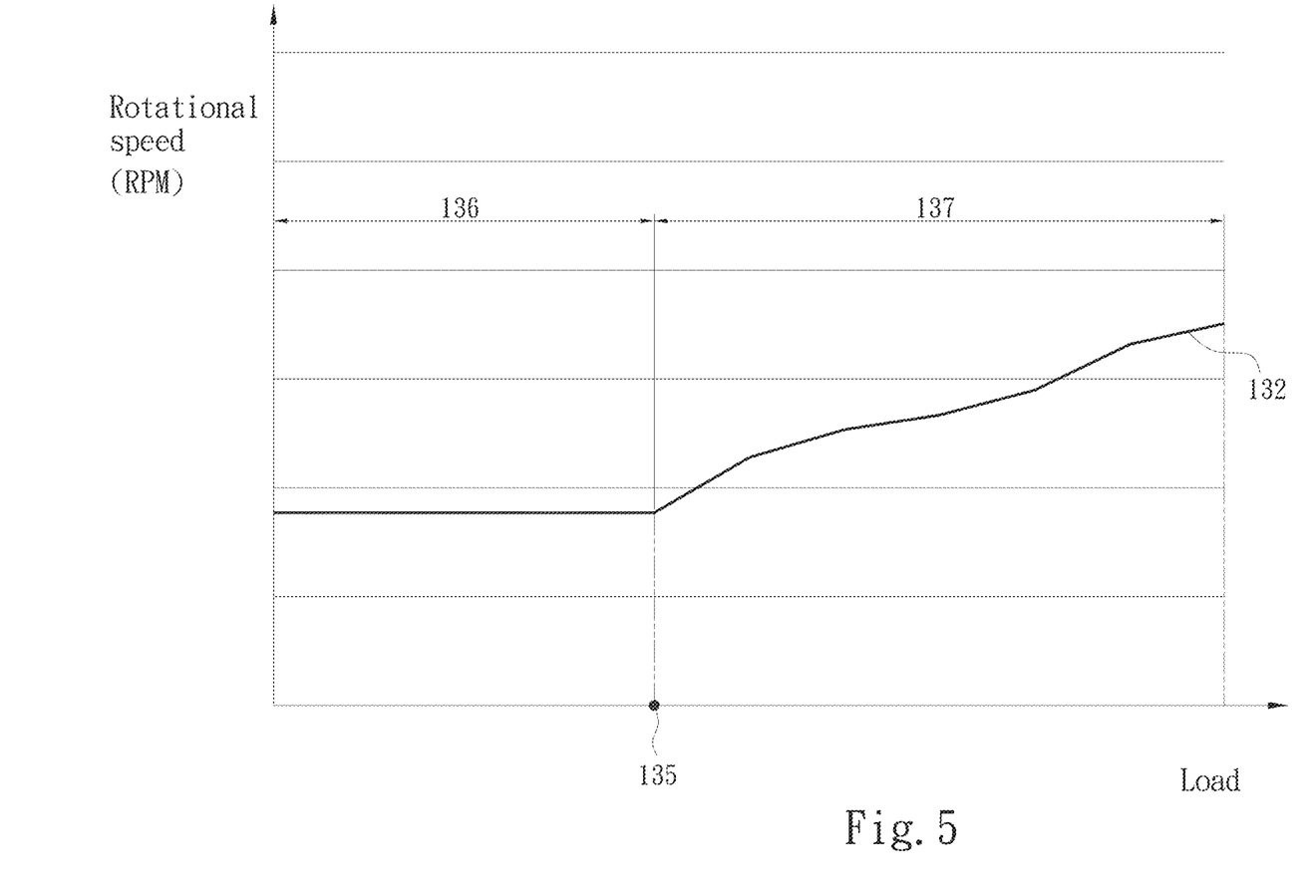
FIG. 5 is a schematic diagram of a rotational speed of a fan in a low-speed operating mode according to an embodiment of the present invention.
Figure 6:
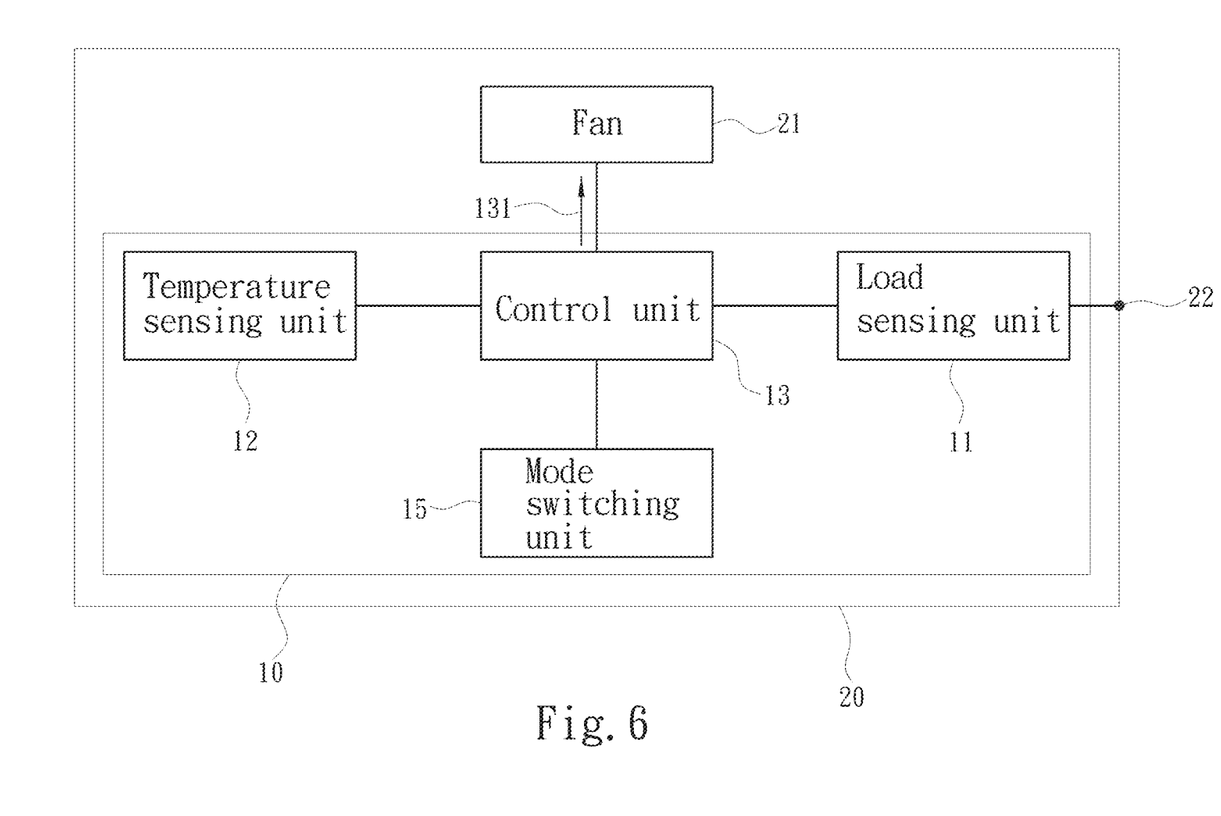
FIG. 6 is a block schematic diagram of a full-speed mode according to an embodiment of the present invention.
Figure 7:
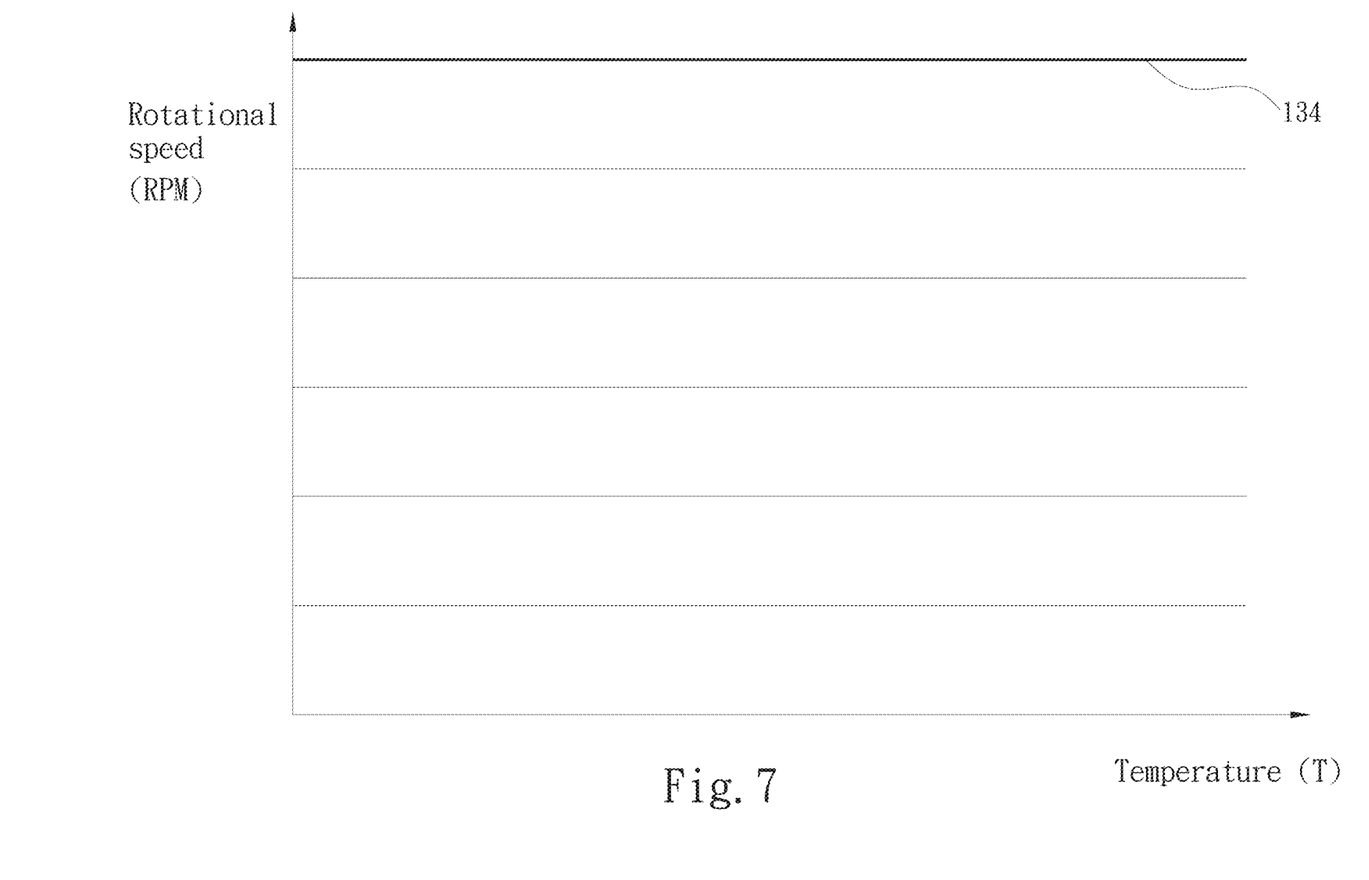
FIG. 7 is a schematic diagram of a rotational speed of a fan in a full-speed operating mode according to an embodiment of the present invention.

Referring to FIG. 1, FIG. 2, and FIG. 3, in one embodiment, the mute mode 133 is divided into a fan suspended operation interval 139 and a plurality of second acceleration intervals 140 according to a plurality of temperature rise thresholds 138. The plurality of second acceleration intervals 140 follows the fan suspended operation interval 139. In practice, if the temperature signal 121 does not reach the lowest threshold among the plurality of temperature rise thresholds 138, the control unit 13 does not drive the fan 21 to run. If the temperature signal 121 exceeds the lowest threshold among the plurality of temperature rise thresholds 138, the control unit 13 controls the fan 21 to run at a rotational speed according to each second acceleration interval 140, such that the rotational speed of the fan 21 in each of the plurality of second acceleration intervals 140 is proportional to the temperature in the power supply device 20. Further, for better understanding, an example of further assuming that the plurality of temperature rise thresholds 138 are respectively 40° C., 45° C. and 50° C. is given below. If the temperature sensing unit 12 senses a temperature in the power supply device 20 lower than 40° C., the control unit 13 does not drive the fan 21; if the temperature sensing unit 12 senses the temperature in the power supply device 20 exceeds 40° C. but not reach 45° C., the control unit 13 transmits the driving signal 131 so as to control the rotational speed of the fan 21 to run at a rotational speed according to one of the plurality of second acceleration intervals 140; and if the temperature sensing unit 12 senses the temperature in the power supply device 20 exceeds 45° C. but not reach 50° C., the control unit 13 controls the fan 21 to run at a rotational speed according to another one of the plurality of second acceleration intervals 140. Further, in one embodiment, the mute mode 133 further includes a second fixed speed interval 141 between two of the plurality of second acceleration intervals 140, and the control unit 13 controls the rotational speed of the fan 21 to be a fixed value when the fan 21 is ran at a rotational speed according to the second fixed speed interval 141.

Figure 9:
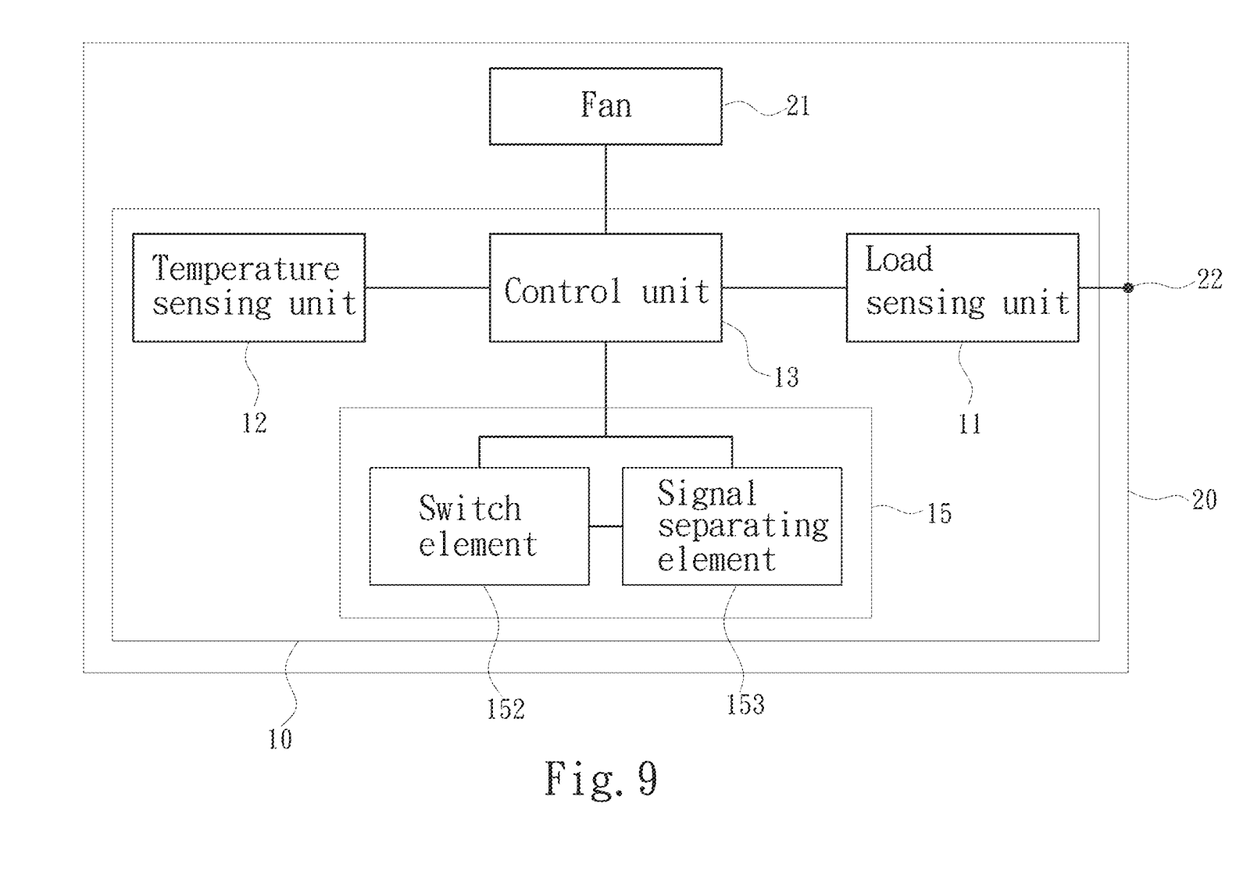
FIG. 9 is a block schematic diagram according to another embodiment of the present invention.

Further, in one embodiment, the mode switching unit 15 is a non-physical switch, and the mode switching unit 15 is controlled by communication with an external electronic device (e.g., a computer). Moreover, the mode switching unit 15 is also designed as a physical switch to be operated by a user. Referring to FIG. 9, the mode switching unit 15 includes at least one switch element 152 provided on an outer side of the power supply device 20, and at least one signal separating element 153 connected to the switch element 152 and the control unit 13. The switch element 152 is for the user to operate when the user wishes to switch the operating mode of the fan 21. The signal separating element 153 is controlled by the switch element 152. The signal separating element 153 is not triggered in a normal condition such that the mode switching signal 151 is not transmitted to the control unit 13. The signal separating element 153 is triggered when the switch element 152 is operated by the user, and the triggered signal separating element 153 then transmits the mode switching signal 151 to the control unit 13, so as to prompt the control unit 13 to enter different operating modes. In one embodiment, the signal separating element 153 is a photocoupler.

What is claimed is:

1. A fan control circuit, which is provided in a power supply device and controlling at least one fan belonged to the power supply device, the fan control circuit comprising:
    a load sensing unit, electrically connected to an output terminal of the power supply device to generate a load signal according to an output condition of the output terminal;
    a temperature sensing unit, sensing a temperature in the power supply device and generating a temperature signal;
    a control unit, electrically connected to the temperature sensing unit, the load sensing unit and the fan, the control unit includes a low-speed operating mode for controlling a rotational speed of the fan according to the load signal, a mute mode for controlling the rotational speed of the fan according to the temperature signal, and a full-speed operating mode for controlling the fan to run at a rated rotational speed, wherein the low-speed operating mode is divided according to a load threshold into a first fixed speed interval and a first acceleration interval following the first fixed speed interval, and the rotational speed of the fan in the first acceleration interval is proportional to a load of the power supply device; and
    a mode switching unit, electrically connected to the control unit, the mode switching unit providing a mode switching signal generated by a user operation to the control unit, wherein the mode switching signal determines that the control unit controls the fan in one of the low-speed operating mode, the mute mode and the full-speed operating mode.

2. The fan control circuit of claim 1, wherein the mute mode is divided into a fan suspended operation interval and a plurality of second acceleration intervals according to a plurality of temperature rise thresholds, and the rotational speed of the fan in each of the plurality of second acceleration intervals is proportional to the temperature in the power supply device.

3. The fan control circuit of claim 2, wherein the mute mode comprises a second fixed speed interval between two of the plurality of second acceleration intervals.

4. The fan control circuit of claim 2, wherein the mode switching unit comprises at least one switch element provided on an outer side of the power supply device, and at least one signal separating element connected to the switch element and the control unit.

5. The fan control circuit of claim 4, wherein the signal separating element is a photocoupler.

6. The fan control circuit of claim 2, wherein the control unit is preset to control the fan by the mute mode.

7. The fan control circuit of claim 1, wherein the mode switching unit comprises at least one switch element provided on an outer side of the power supply device, and at least one signal separating element connected to the switch element and the control unit.

8. The fan control circuit of claim 7, wherein the signal separating element is a photocoupler.

9. The fan control circuit of claim 7, wherein the control unit is preset to control the fan by the mute mode.

* * * * *